(12) United States Patent
Han

(10) Patent No.: US 8,603,919 B2
(45) Date of Patent: Dec. 10, 2013

(54) METHOD FOR FABRICATING SEMICONDUCTOR DEVICE

(75) Inventor: Jung-Dae Han, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 20 days.

(21) Appl. No.: 13/475,085

(22) Filed: May 18, 2012

(65) Prior Publication Data

US 2013/0157441 A1 Jun. 20, 2013

(30) Foreign Application Priority Data

Dec. 19, 2011 (KR) ........................ 10-2011-0137626

(51) Int. Cl.
*H01L 21/311* (2006.01)
*H01L 21/469* (2006.01)
*H01L 21/31* (2006.01)

(52) U.S. Cl.
USPC ......................................... 438/702; 438/763

(58) Field of Classification Search
USPC ................................. 438/702, 763
See application file for complete search history.

(56) References Cited

U.S. PATENT DOCUMENTS

| 2011/0079871 A1* | 4/2011 | Kim | ............................... 257/510 |
| 2012/0108070 A1* | 5/2012 | Kim | ............................... 438/703 |
| 2012/0171867 A1* | 7/2012 | Kim | ............................... 438/702 |

FOREIGN PATENT DOCUMENTS

| KR | 1020120003743 | 1/2012 |
| KR | 1020120120666 | 11/2012 |

\* cited by examiner

*Primary Examiner* — Luan C Thai
(74) *Attorney, Agent, or Firm* — IP & T Group LLP

(57) ABSTRACT

A semiconductor device fabricating method includes forming an etch target layer and a first hard mask layer over a substrate, forming a second hard mask pattern having lines over the first hard mask layer, forming a third hard mask layer over the second hard mask pattern, forming a sacrificial pattern over the third hard mask layer, forming a cell spacer on sidewalls of the sacrificial pattern, removing the sacrificial pattern, etching the third hard mask layer using the cell spacer as an etch barrier, etching the first hard mask layer using the third hard mask pattern and the second hard mask pattern as etch barriers, forming an elliptical opening having an axis pointing in a second direction by etching the etch target layer, and forming a silicon layer that fills the elliptical opening.

20 Claims, 10 Drawing Sheets

CELL REGION

PERIPHERAL REGION

CELL REGION

PERIPHERAL REGION

CELL REGION

CELL REGION

CELL REGION

PERIPHERAL REGION

CELL REGION

METHOD FOR FABRICATING SEMICONDUCTOR DEVICE

CROSS-REFERENCE TO RELATED APPLICATIONS

The present application claims priority of Korean Patent Application No. 10-2011-0137626, filed on Dec. 19, 2011, which is incorporated herein by reference in its entirety.

BACKGROUND

1. Field

Exemplary embodiments of the present invention relate to semiconductor design technology, and more particularly, to a method for forming active regions of a semiconductor device.

2. Description of the Related Art

As devices are highly integrated, a line width of a pattern becomes narrower. Due to technical limitations of exposure equipment, patterning with the use of conventional photoresist layer may be difficult.

To overcome the limitation, a Double Patterning Technology (DPT) process may be used. Particularly, a Spacer Patterning Technology (SPT) process using spacers may be used.

In addition, when patterns are to be formed in both cell regions and peripheral regions, such as an isolation layer, simultaneously forming patterns in both cell regions and peripheral regions according to the SPT process may be difficult. Therefore, patterns are formed in the cell regions first, and subsequently, a single mask process is additionally performed in the peripheral regions.

Therefore, the number of steps in a manufacturing process is increased and exposure equipment has to be additionally used. These features decrease margin and makes the patterning difficult. Furthermore, even after the final patterns are formed, the patterns may lean during a subsequent cleaning process due to the delicacy of the patterns.

SUMMARY

An embodiment of the present invention is directed to a semiconductor device fabrication method that prevents a decrease in process margins and leaning of patterns.

In accordance with an embodiment of the present invention, a method for fabricating a semiconductor device includes: forming an etch target layer over a substrate; forming a first hard mask layer over the etch target layer; forming a second hard mask pattern having lines that extend in a first direction over the first hard mask layer; forming a third hard mask layer over the second hard mask pattern; forming a sacrificial pattern having lines that extend in a second direction crossing the first direction in an oblique direction over the third hard mask layer; forming a cell spacer on sidewalls of the sacrificial pattern; removing the sacrificial pattern; etching the third hard mask layer using the cell spacer as an etch barrier to form a third hard mask pattern; etching the first hard mask layer using the third hard mask pattern and the second hard mask pattern as etch barriers to form a first hard mask pattern; forming an elliptical opening having an axis pointing in the second direction by etching the etch target layer using the first hard mask pattern as an etch barrier; and forming a silicon layer that fills the elliptical opening.

In accordance with another embodiment of the present invention, a method for fabricating a semiconductor device includes: forming an etch target layer over a substrate having cell regions and peripheral regions; forming a first hard mask layer over the etch target layer; forming a second hard mask pattern having lines that extend in a first direction over the first hard mask layer in the cell regions; forming a third hard mask layer over the second hard mask pattern in the cell regions and over the first hard mask layer in the peripheral regions; forming a sacrificial pattern having lines that extend in a second direction crossing the first direction in an oblique direction over the third hard mask layer; forming a cell spacer and a peripheral spacer on sidewalls of the sacrificial pattern; removing the sacrificial pattern of the cell regions; etching the third hard mask layer using the cell spacer in the cell regions, and etching the third hard mask using the peripheral spacer and the sacrificial pattern in the peripheral regions as etch barriers to form a third hard mask pattern; etching the first hard mask layer using the second hard mask pattern of the cell regions and the third hard mask pattern as etch barriers to form a first hard mask pattern; forming an elliptical cell opening having an axis pointing in the second direction and a peripheral opening having lines that extend in the second direction by etching the etch target layer using the first hard mask pattern as an etch barrier; and forming a silicon layer filling the elliptical cell opening and the peripheral opening.

DETAILED DESCRIPTION

Figure 1A:
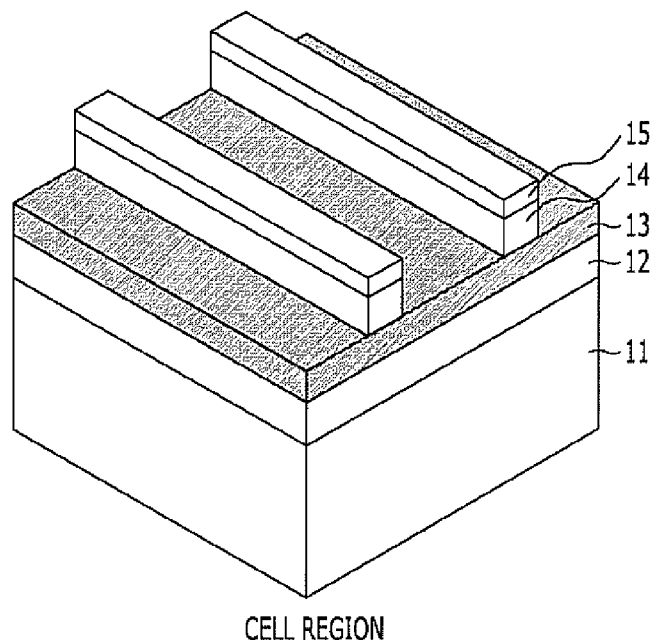
FIGS. 1A to 1K are perspective views illustrating a method for fabricating a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1B:
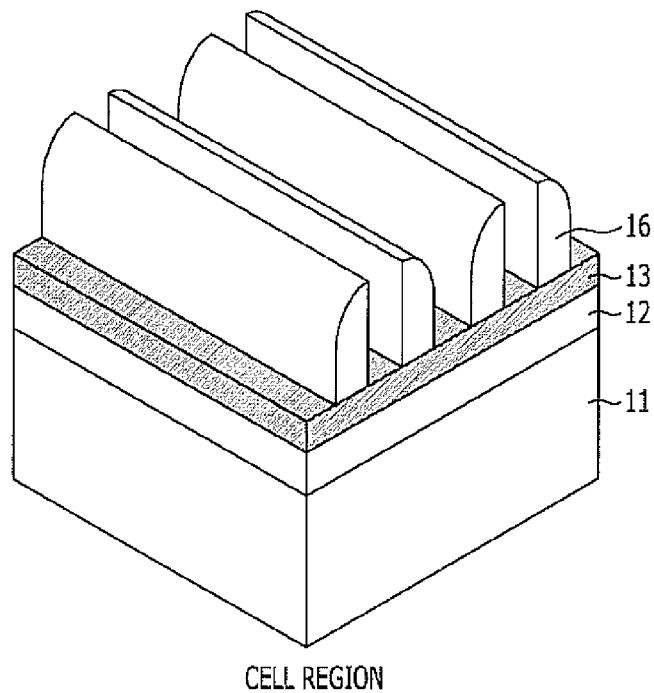
Figure 1C:
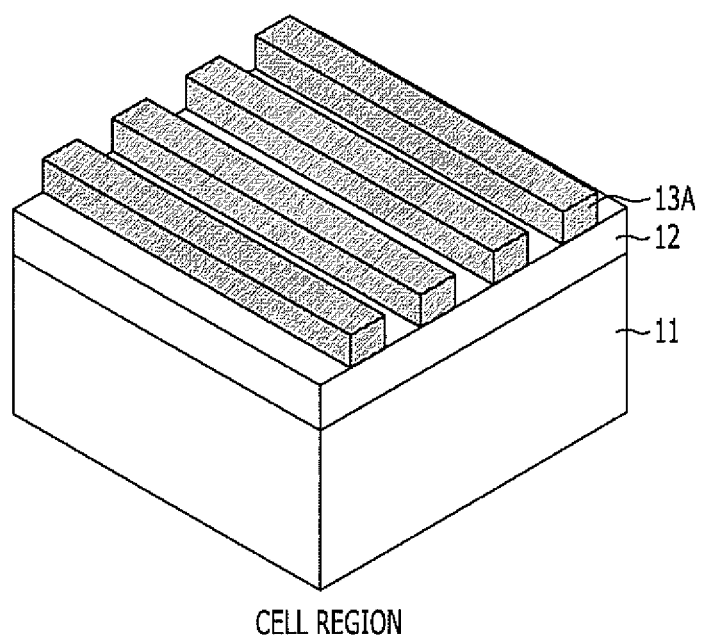

FIGS. 1A to 1K are perspective views illustrating a method for fabricating a semiconductor device in accordance with an embodiment of the present invention. FIGS. 1A to 1C illustrate a process of forming patterns in cell regions. Since patterns are not formed in peripheral regions in the steps shown in FIGS. 1A to 1C, these figures shows cell regions only.

Referring to FIG. 1A, an etch target layer 11 is formed on a substrate (not shown) having cell regions and peripheral regions. The etch target layer 11 serves as a mask for defining active regions and as an isolation layer for insulating the active regions from each other. For example, the etch target layer 11 may include an oxide layer, and the etch target layer 11 may include all insulation materials that may be used as an isolation layer.

Subsequently, a first hard mask layer 12 and a second hard mask layer 13 are stacked over the etch target layer 11. The first hard mask layer 12 serves as an etch barrier of the etch target layer 11. For example, the first hard mask layer 12 may be a nitride layer, and the first hard mask layer 12 may include any materials having an etch selectivity from the etch target layer 11 other than a nitride layer.

The second hard mask layer 13 serves as an etch barrier for etching the first hard mask layer 12, and the second hard mask layer 13 defines a first line pattern that is used to perform a Mesh Spacer Patterning Technology (SPT) process. For example, the second hard mask layer 13 may be a polysilicon layer and may include any materials having an etch selectivity from the first hard mask layer 12 other than a polysilicon layer.

Subsequently, a first sacrificial pattern 14 is formed over the second hard mask layer 13 in the cell region. The first sacrificial pattern 14 is used for forming a spacer pattern, and the first sacrificial pattern 14 is formed of a material that may be easily removed when formed in a line shape. For example, the first sacrificial pattern 14 is a carbon layer, such as an amorphous carbon layer or a Spin-On Carbon (SOC) layer. The first sacrificial pattern 14 may be formed of any materials having an etch selectivity from the second hard mask layer 13 and a spacer pattern, which is to be formed subsequently, other than a carbon layer. In this embodiment of the present invention, the first sacrificial pattern 14 is an SOC layer for illustration purposes.

Before the first sacrificial pattern 14 is formed, the upper surface of the second hard mask layer 13 is coated with an SOC layer. Subsequently, a first silicon oxynitride layer 15 and a photoresist layer pattern (not shown) having lines that extend in the first direction are formed over the SOC layer. Subsequently, the first silicon oxynitride layer 15 and the SOC layer are etched by using the photoresist layer pattern (not shown) as an etch barrier. Since the photoresist layer pattern (not shown) defines the first sacrificial pattern 14 in the cell regions, the SOC layer in the peripheral regions are all removed when the first sacrificial pattern 14 is formed. In short, the first sacrificial pattern 14 remains over the second hard mask layer 13 in the cell regions, and the second hard mask layer 13 is exposed in the peripheral regions.

Referring to FIG. 1B, a first cell spacer 16 is formed on the sidewalls of the first sacrificial pattern 14 (refer to FIG. 1A). The first cell spacer 16 is formed in the cell regions where the first sacrificial pattern 14 (refer to FIG. 1A) is formed.

In order to form the first cell spacer 16, a spacer material layer is formed over the profile of the substrate structure including the first sacrificial pattern 14 (refer to FIG. 1A). Subsequently, the spacer material layer is etched to remain on the sidewalls of the first sacrificial pattern 14 (refer to FIG. 1A). The first sacrificial pattern 14 (refer to FIG. 1A) is subsequently removed to have the first cell spacer 16 remain on the second hard mask layer 13. Since the first cell spacer 16 is formed on the sidewalls of the first sacrificial pattern 14 (refer to FIG. 1A), the first cell spacer 16 is also having lines that extend in the first direction.

For example, the spacer material layer for forming the first cell spacer 16 may be an oxide layer. Other than an oxide layer, the spacer material layer may include any materials having an etch selectivity from the sacrificial pattern and the second hard mask layer 13. Since the spacer material layer is used for forming a pattern, the spacer material layer may be formed of a material having excellent step coverage through a method for obtaining excellent step coverage.

Referring to FIG. 1C, the second hard mask layer 13 (refer to FIG. 1B) is etched using the first cell spacer 16 (refer to FIG. 1B) as an etch barrier. As a result, a second hard mask pattern 13A is formed. The second hard mask pattern 13A has lines that extend in the first direction.

Subsequently, the first cell spacer 16 (refer to FIG. 1B) is removed.

Figure 1D:
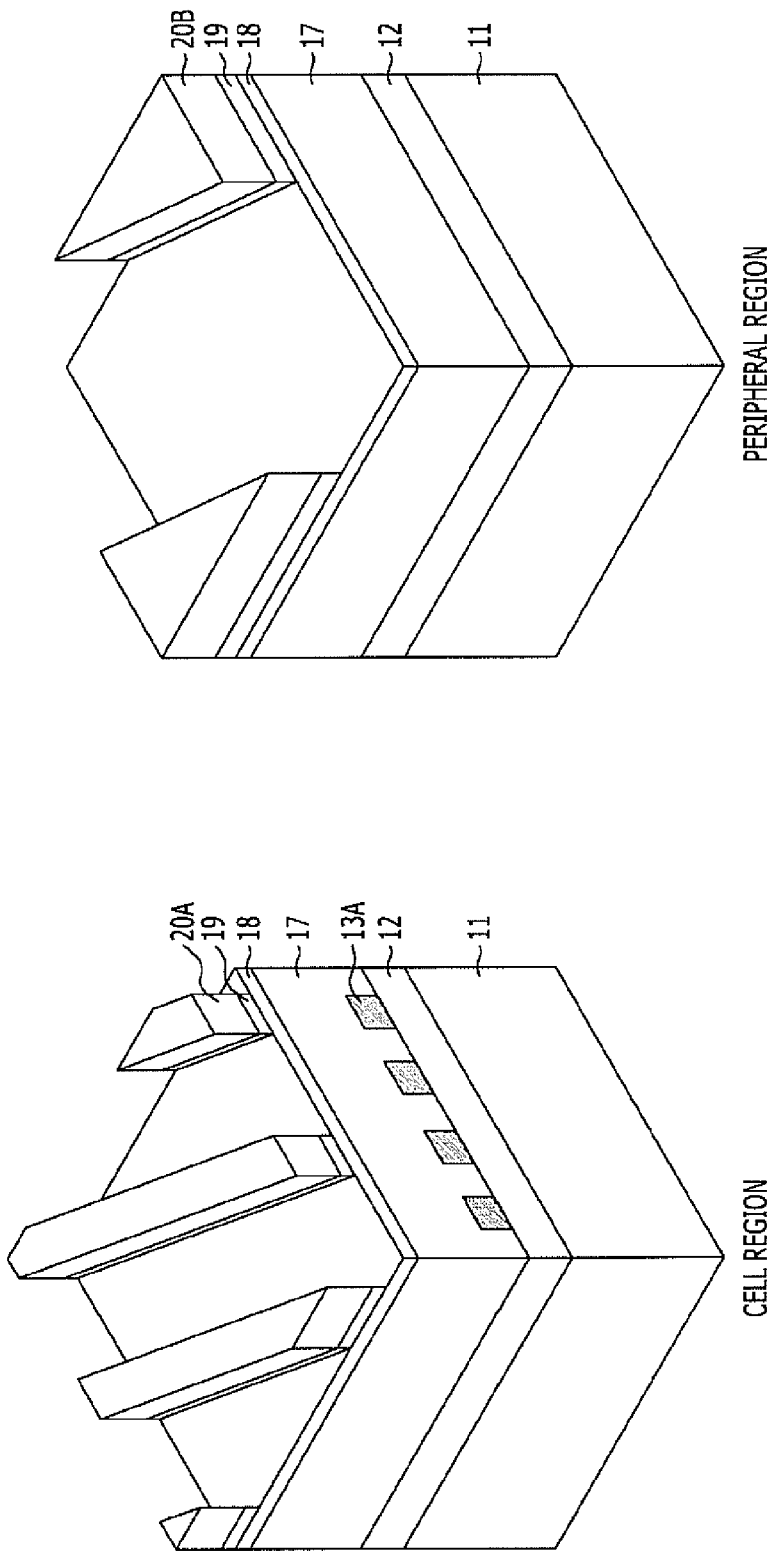

Referring to FIG. 1D, a third hard mask layer 17 is formed over the substrate structure including the second hard mask pattern 13A in the cell regions. The third hard mask layer 17 is formed to have a sufficient thickness to cover the second hard mask pattern 13A both in the cell regions and the peripheral regions.

The third hard mask layer 17 is used as an etch barrier for performing a mesh SPT process along with the second hard mask pattern 13A in the cell regions, and the third hard mask layer 17 is used as an etch barrier for defining a line pattern in the peripheral regions. For example, the third hard mask layer 17 may be a carbon layer, such as an amorphous carbon layer or an Spin-On-Carbon (SOC) layer, and the third hard mask layer 17 may include any materials having an etch selectivity from the second hard mask pattern 13A and the first hard mask layer 12.

Subsequently, a second silicon oxynitride layer 18 is formed over the third hard mask layer 17. The second silicon oxynitride layer 18 serves as an etch barrier for etching the third hard mask layer 17.

Subsequently, an anti-reflection layer 19 and second sacrificial patterns 20A and 20B are formed over the second silicon oxynitride layer 18. The second sacrificial patterns 20A and 20B in the cell regions are formed in different patterns than in the peripheral regions. In other words, the second sacrificial patterns 20A serves as sacrificial patterns for forming a spacer pattern in the cell regions, and the second sacrificial patterns 20B serves as masks for defining a pattern in the peripheral regions. Particularly, in the peripheral regions, the second sacrificial patterns 20B may be formed through a negative exposure process to expose an area where a pattern is to be formed. More specifically, the second sacrificial patterns 20A and 20B may be photoresist layer patterns.

The second sacrificial patterns 20A and 20B are formed in a line that extends in the same direction in the cell regions and the peripheral regions. To be specific, the second sacrificial patterns 20A and 20B extend in a second direction of an oblique direction that is tilted at a designated angle from the first direction. In addition, since a line width of the patterns to be formed in the cell regions is different than a line width of the patterns to be formed in the peripheral regions, the second sacrificial patterns 20A and 20B are formed in the corresponding line widths in the cell regions and the peripheral regions, respectively. The second sacrificial pattern 20B in the peripheral regions may have a wider line width than the second sacrificial pattern 20A in the cell regions.

Figure 1E:
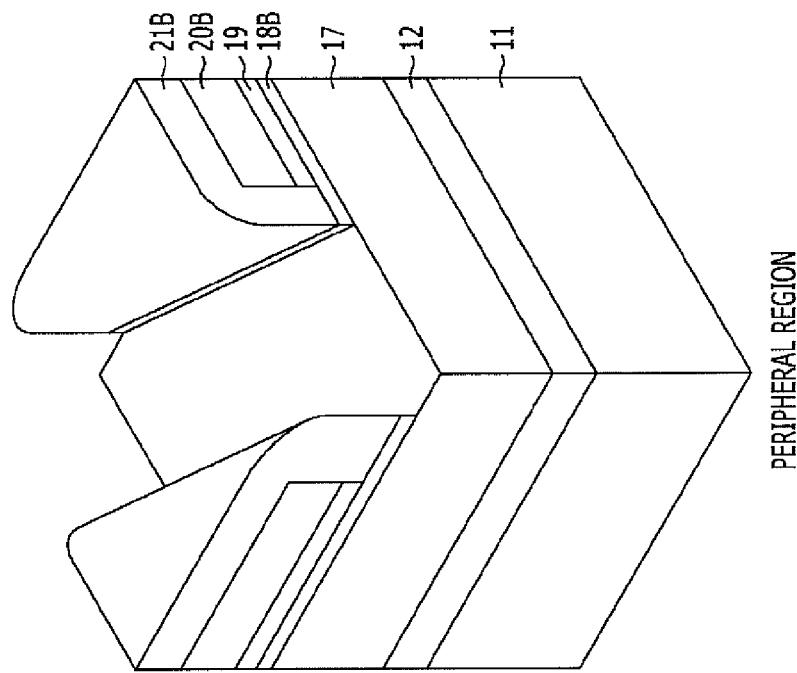
Figure 1E:
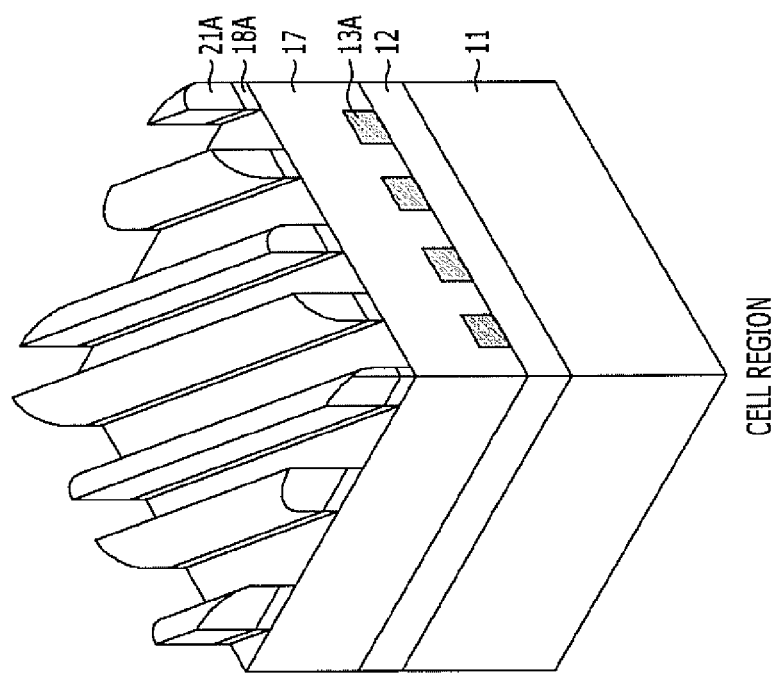

Referring to FIG. 1E, a second cell spacer 21A and a peripheral spacer 21B are formed in the cell regions and the peripheral regions, respectively. The second cell spacer 21A and the peripheral spacer 21B are formed by forming a spacer material layer over the profile of the substrate structure including the second sacrificial patterns 20A and 20B in the cell regions and the peripheral regions, and etching the spacer material layer to remain on the sidewalls of the second sacrificial patterns 20A and 20B (refer to FIG. 1D). During the etch process, an etch loading difference is caused in the cell regions and the peripheral regions so that the upper portion of the second sacrificial pattern 20A is exposed in the cell regions and the spacer material layer remains in at a designated thickness in the upper portion of the second sacrificial pattern 20B in the peripheral regions.

For example, the spacer material layer for forming the second cell spacer 21A and the peripheral spacer 21B may be an oxide layer. Other than an oxide layer, the spacer material layer may include any materials having an etch selectivity from the second sacrificial patterns 20A and 20B (refer to FIG. 1D).

As a result, the second cell spacer 21A is formed on the sidewalls of the second sacrificial pattern 20A (refer to FIG. 1D) in the cell regions, and the peripheral spacer 21B is formed on the sidewalls and on upper portion of the second sacrificial pattern 20B in the peripheral regions. As a result, the sacrificial pattern and the peripheral spacer are merged. The peripheral regions, therefore, may secure a line width as much as the sacrificial pattern and the peripheral spacer are merged, and thus patterning may be performed without a decrease in the margins.

Subsequently, the second sacrificial pattern 20A (refer to FIG. 1D) of the cell regions is removed. The second sacrificial pattern 20B of the peripheral regions is not exposed by the peripheral spacer 21B, and the second sacrificial pattern 20B is not removed. When the second sacrificial pattern 20A (refer to FIG. 1D) is a carbon layer, it is removed through a dry etch process, and the dry etch process includes an oxygen stripping process.

Subsequently, the second silicon oxynitride layer 18 (refer to FIG. 1D) is etched. The second silicon oxynitride layer 18 (refer to FIG. 1D) is patterned to have a different line width in the cell regions than in the peripheral regions. The second silicon oxynitride layer 18 patterned in the cell regions is referred to as a second silicon oxynitride layer pattern 18A, and the second silicon oxynitride layer 18 patterned in the peripheral regions is referred to as a second silicon oxynitride layer pattern 18B. The second silicon oxynitride layer pattern 18A is patterned with the same line width as the second cell spacer 21A, and the second silicon oxynitride layer pattern 18B in the peripheral regions is patterned with the same line width as the peripheral spacer 21B and the second sacrificial pattern 20B.

Figure 1F:
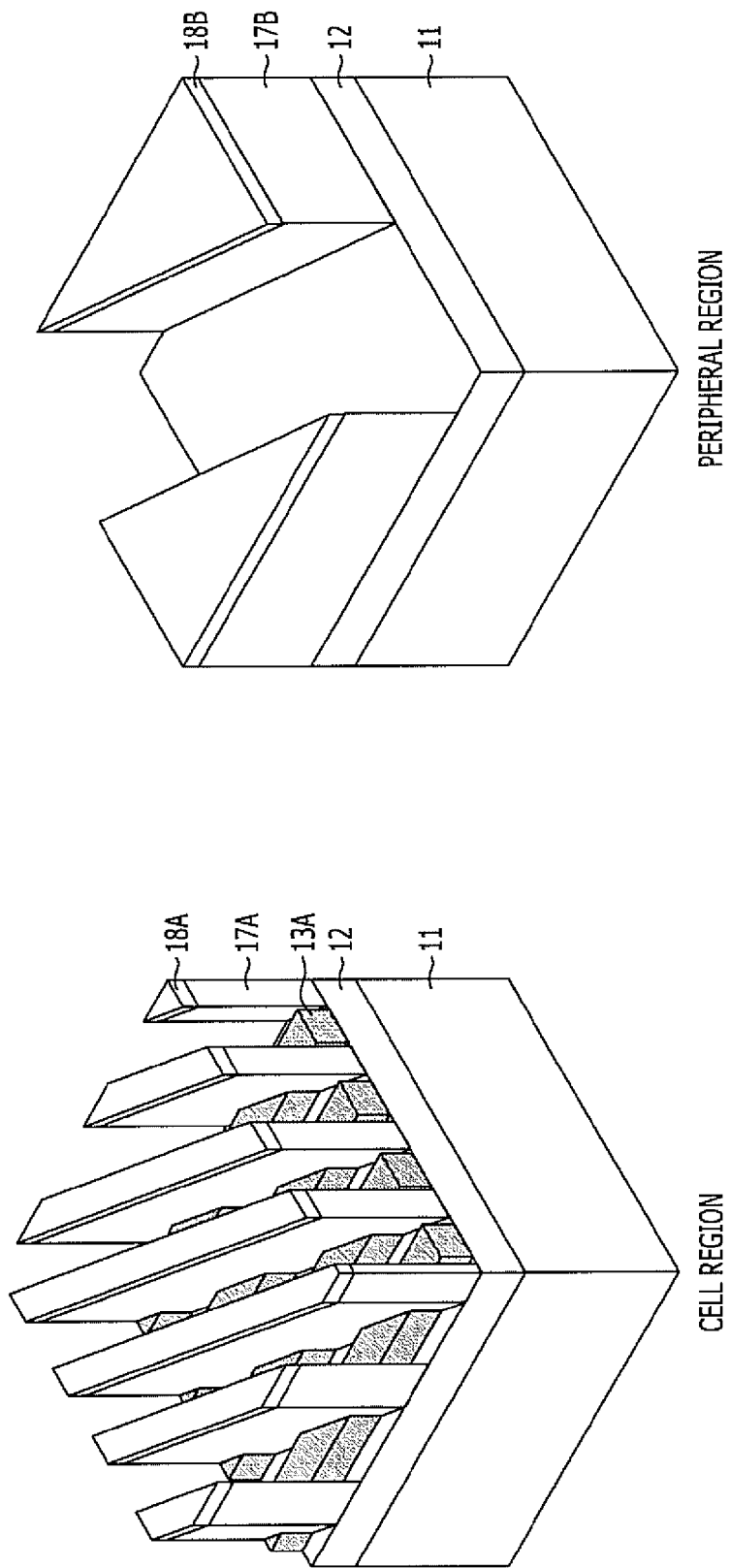

Referring to FIG. 1F, the third hard mask layer 17 (refer to FIG. 1E) is etched. The third hard mask layer 17 (refer to FIG. 1E) is patterned to have the same line width as the second silicon oxynitride layer patterns 18A and 18B of the cell regions and the peripheral regions. Therefore, third hard mask layer patterns 17A and 17B having different line widths in the cell regions and the peripheral regions are formed.

The structure formed on the second silicon oxynitride layer patterns 18A and 18B may be removed before the third hard mask layer patterns 17A and 17B are etched, or the structure formed on the second silicon oxynitride layer patterns 18A and 18B may be removed after the third hard mask layer patterns 17A and 17B are formed.

In the cell regions, portions of the second hard mask pattern 13A are exposed. In the peripheral regions, since no second hard mask pattern 13A is formed, the first hard mask layer 12 is exposed.

Figure 1G:
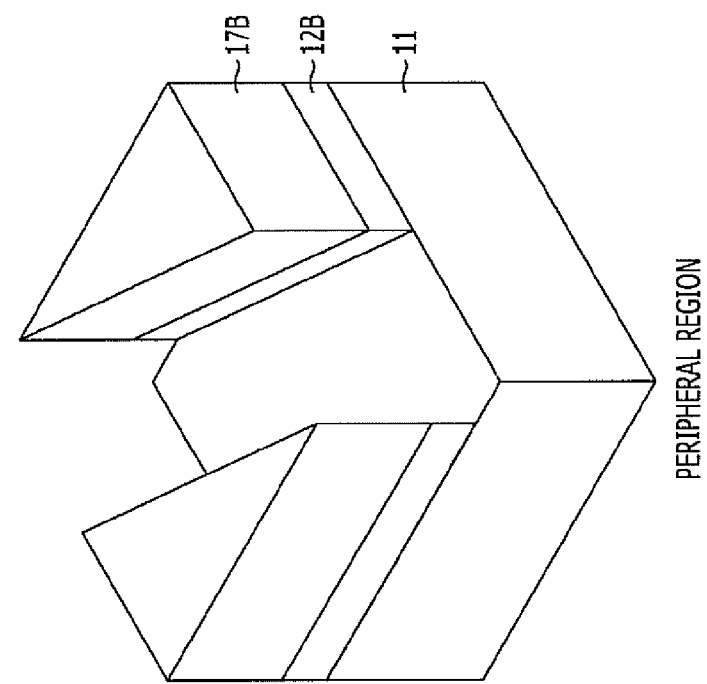
Figure 1G:
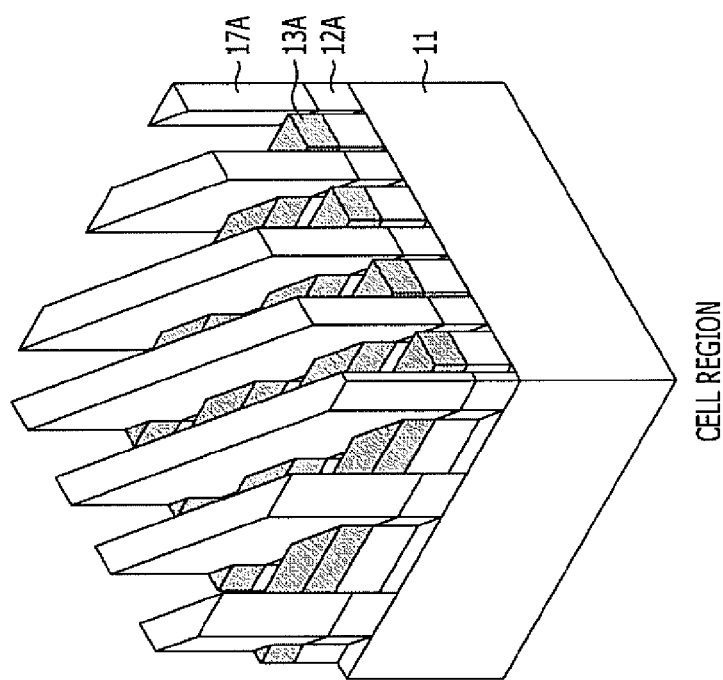

Referring to FIG. 1G, the first hard mask layer 12 (refer to FIG. 1F) is etched. In the cell regions, the first hard mask layer 12 (refer to FIG. 1F) is patterned using the second hard mask pattern 13A and the third hard mask layer pattern 17A as an etch barrier. In the peripheral regions, the first hard mask layer 12 (refer to FIG. 1F) is patterned using the third hard mask layer pattern 17B as an etch barrier. The patterned first hard mask layer is referred to as first hard mask layer patterns 12A in the cell regions and the first hard mask layer is referred to as first hard mask layer patterns 12B in the peripheral regions.

Figure 1H:
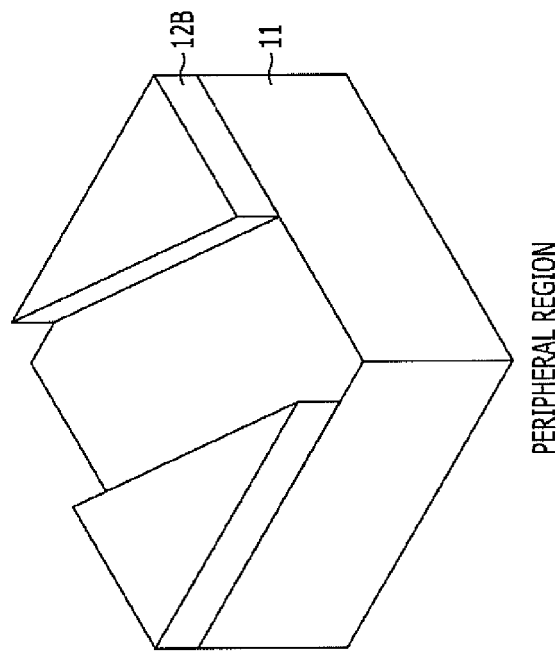
Figure 1H:
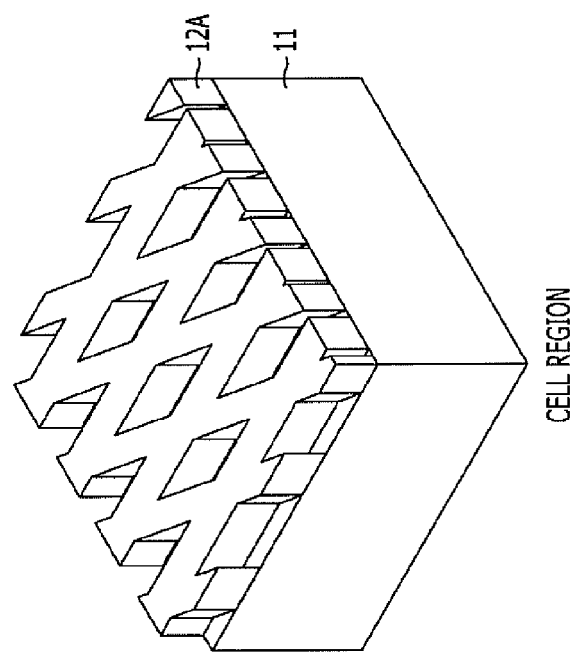

Referring to FIG. 1H, the second hard mask pattern 13A of the cell regions and the third hard mask layer patterns 17A and 17B of the cell regions and the peripheral regions are removed. If the second hard mask pattern 13A and the third hard mask layer patterns 17A and 17B, which have different step heights, are removed in advance, pattern asymmetry caused by the step heights may be prevented.

As a result, the first hard mask layer pattern 12A is formed in a mesh type of oblique direction in the cell regions, and the first hard mask layer pattern 12B has lines that extend in the second direction in the peripheral regions.

Figure 1I:
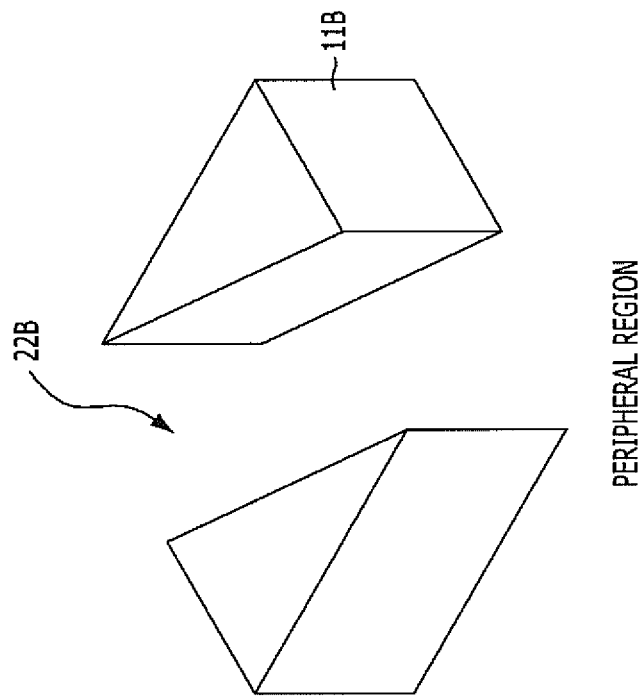
Figure 1I:
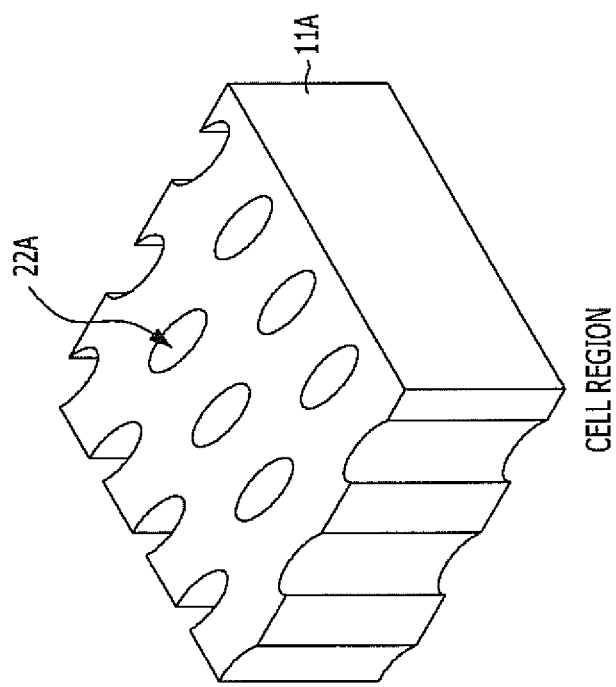

Referring to FIG. 1I, the etch target layer 11 (refer to FIG. 1H) is etched. In the cell regions, an elliptical cell opening 22A of an oblique direction is formed using the mesh-type first hard mask layer pattern 12A as an etch barrier. In the peripheral regions, a peripheral opening 22B having lines that extend in the second direction is formed using the first hard mask layer pattern 12B as an etch barrier. While the first hard mask layer pattern does not have a round mesh, since the edge portions are smoothly etched during the process of etching the etch target layer 11 (refer to FIG. 1H), the elliptical cell opening 22A is formed.

For example, when the etch target layer 11 (refer to FIG. 1H) includes an oxide layer and the first hard mask layer patterns 12A and 12B include a nitride layer, the etch process may be performed under the condition of self-aligned contact etch that minimizes loss of the nitride layer. For example, the process of etching the etch target layer 11 (refer to FIG. 1H) may be performed using a mixed gas of $C_4F_6$ and $C_4F_8$, and all single gas or a mixed gas that selectively etches an oxide layer with an etch selectivity from a nitride layer may be used.

Therefore, an etch target layer pattern 11A including the elliptical cell opening 22A is formed in the cell regions, and an etch target layer pattern 11B including the peripheral opening 22B is formed in the peripheral regions.

Subsequently, the first hard mask layer pattern 12A and 12B is removed.

Figure 1J:
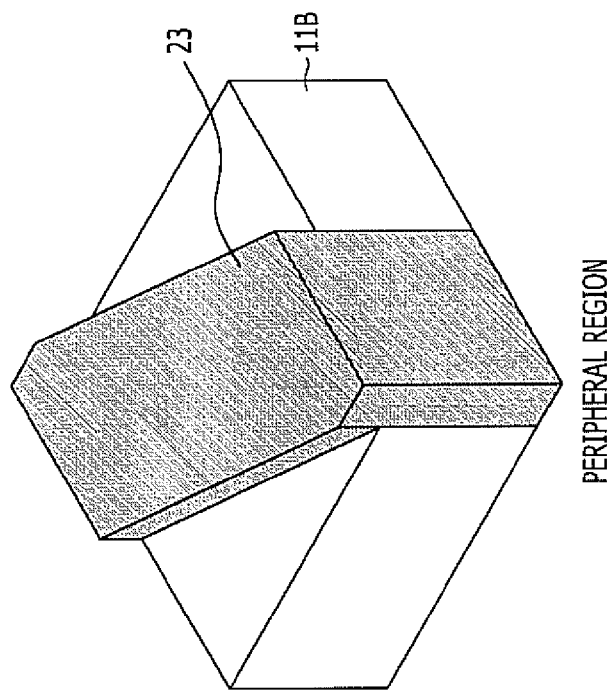
Figure 1J:
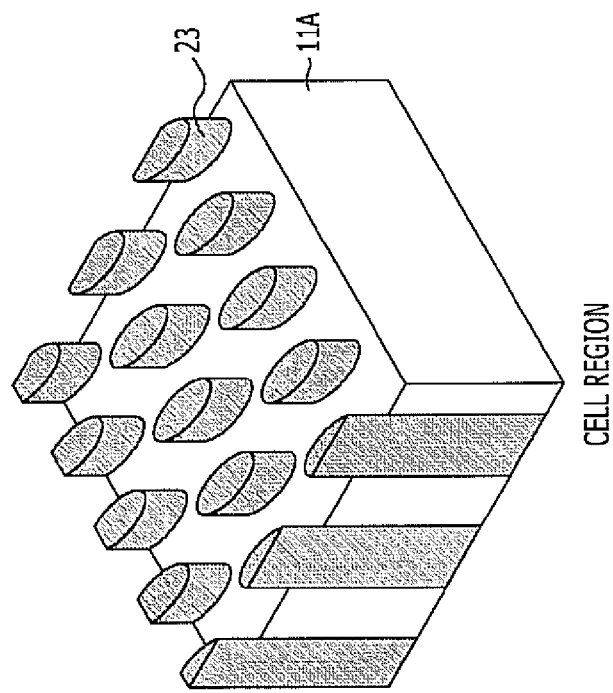

Referring to FIG. 1J, a monocrystalline silicon layer 23 filling the elliptical cell opening 22A and the peripheral opening 22B is formed. The monocrystalline silicon layer 23 may be formed through a Selective Epitaxial Growing (SEG) process. The etch target layer patterns 11A and 11B including the elliptical cell opening 22A and the peripheral opening 22B serve as a growth mold of the monocrystalline silicon layer 23.

Figure 1K:
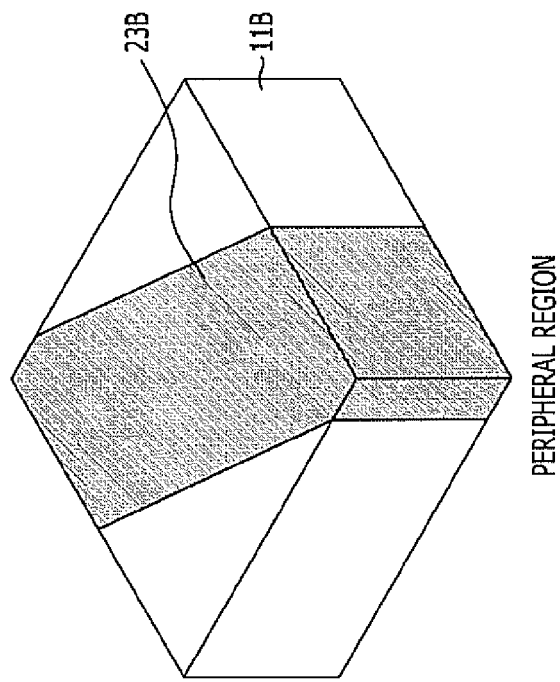
Figure 1K:
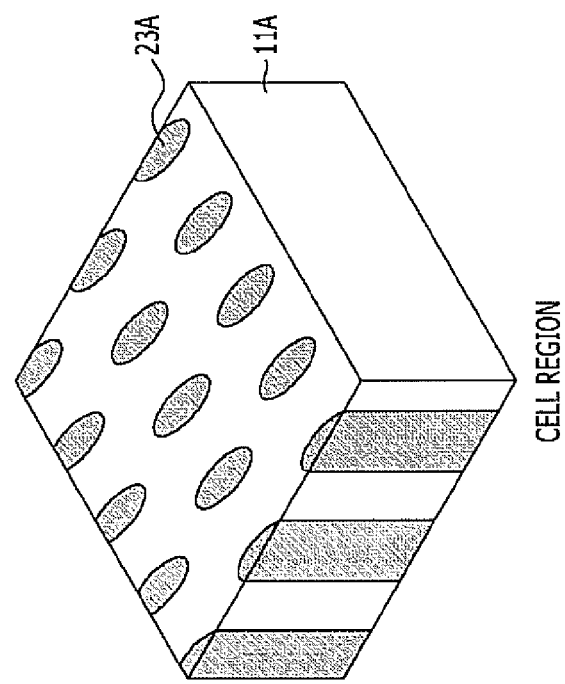

Referring to FIG. 1K, the monocrystalline silicon layer 23 (refer to FIG. 13) is planarized until an upper surface of the etch target layer patterns 11A and 11B are exposed.

Therefore, island-shape active regions 23A are formed in the cell regions, and line-shape active regions 23B are formed in the peripheral regions.

Particularly, the etch target layer patterns 11A and 11B surrounding the active regions 23A and 23B serve as an isolation layer 11A of the cell regions and an isolation layer 11B of the peripheral regions.

Therefore, a cutting process for dividing the active regions may be omitted, and delicate patterns may be prevented from leaning in a subsequent cleaning process. Also, since the active regions 23A and 23B are simultaneously formed in the cell regions and the peripheral regions, the number of procedural steps may be decreased, and accordingly, process margins may be reduced. Furthermore, since the growth mold for forming the active regions serve as an isolation layer, an additionally a process for forming an isolation layer may be omitted.

According to an embodiment of the present invention, the semiconductor device fabrication method may omit a cutting process and prevent patterns from leaning.

Also, the semiconductor device fabrication method may omit an additional process for forming an isolation layer, reduce the number of processes, and decrease process margins.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming an etch target layer over a substrate;
    forming a first hard mask layer over the etch target layer;
    forming a second hard mask pattern having lines that extend in a first direction over the first hard mask layer;
    forming a third hard mask layer over the second hard mask pattern;
    forming a sacrificial pattern having lines that extend in a second direction crossing the first direction in an oblique direction over the third hard mask layer;
    forming a cell spacer on sidewalls of the sacrificial pattern;
    removing the sacrificial pattern;
    etching the third hard mask layer using the cell spacer as an etch barrier to form a third hard mask pattern;
    etching the first hard mask layer using the third hard mask pattern and the second hard mask pattern as etch barriers to form a first hard mask pattern;
    forming an elliptical opening having an axis extending in the second direction by etching the etch target layer using the first hard mask pattern as an etch barrier; and
    forming a silicon layer that fills the elliptical opening.

2. The method of claim 1, wherein the first hard mask layer includes a nitride layer, and the second hard mask pattern includes a polysilicon layer pattern.

3. The method of claim 1, wherein the sacrificial pattern includes a carbon layer.

4. The method of claim 1, wherein the sacrificial pattern includes a spin-on-carbon (SOC) layer.

5. The method of claim 1, wherein the cell spacer includes an oxide layer.

6. The method of claim 1, wherein the silicon layer is formed through a selective epitaxial growing (SEG) process.

7. The method of claim 1, wherein the forming of a second hard mask pattern comprises:
    forming a second hard mask layer over the etch target layer and the first hard mask layer;
    forming a second sacrificial pattern over the second hard mask layer;
    forming a spacer on sidewalls of the second sacrificial pattern;
    removing the second sacrificial pattern;
    etching the second hard mask layer using the spacer as an etch barrier to form the second hard mask pattern; and
    removing the spacer.

8. The method of claim 7, wherein the second sacrificial pattern includes a amorphous carbon or a spin-on-carbon (SOC) layer.

9. The method of claim 7, wherein the spacer includes an oxide layer.

10. A method for fabricating a semiconductor device, comprising:
    forming an etch target layer over a substrate having cell regions and peripheral regions;
    forming a first hard mask layer over the etch target layer;
    forming a second hard mask pattern having lines that extend in a first direction over the first hard mask layer in the cell regions;
    forming a third hard mask layer over the second hard mask pattern in the cell regions and over the first hard mask layer in the peripheral regions;
    forming a sacrificial pattern having lines that extend in a second direction crossing the first direction in an oblique direction over the third hard mask layer;
    forming a cell spacer and a peripheral spacer on sidewalls of the sacrificial pattern;
    removing the sacrificial pattern of the cell regions;
    etching the third hard mask layer using the cell spacer in the cell regions, and etching the third hard mask using the peripheral spacer and the sacrificial pattern in the peripheral regions as etch barriers to form a third hard mask pattern;
    etching the first hard mask layer using the second hard mask pattern of the cell regions and the third hard mask pattern as etch barriers to form a first hard mask pattern;
    forming an elliptical cell opening having an axis pointing in the second direction and a peripheral opening having lines that extend in the second direction by etching the etch target layer using the first hard mask pattern as an etch barrier; and
    forming a silicon layer filling the elliptical cell opening and the peripheral opening.

11. The method of claim 10, wherein the peripheral regions have a line width that is the same as the combined line width of the peripheral spacer and the sacrificial pattern in the etching of the third hard mask layer.

12. The method of claim 10, wherein in the forming of the sacrificial pattern having lines that extend in the second direction crossing the first direction in the oblique direction over the third hard mask layer,
    the sacrificial pattern of the peripheral regions is formed through a negative exposure method.

13. The method of claim 10, wherein the first hard mask layer includes a nitride layer, and the second hard mask pattern includes a polysilicon layer.

14. The method of claim 10, wherein the sacrificial pattern includes a carbon layer.

15. The method of claim 10, wherein the cell spacer and the peripheral spacer include an oxide layer.

16. The method of claim 10, wherein the silicon layer is formed through a selective epitaxial growing (SEG) process.

17. The method of claim 10, wherein the forming of a second hard mask pattern comprises:
    forming a second hard mask layer over the etch target layer and the first hard mask layer;
    forming a second sacrificial pattern over the second hard mask layer of the cell regions;
    forming a spacer on sidewalls of the second sacrificial pattern of the cell regions;
    removing the second sacrificial pattern;
    etching the second hard mask layer of the cell region using the spacer as an etch barrier to form the second hard mask pattern; and
    removing the spacer.

18. The method of claim 17, wherein the second hard mask layer of the peripheral regions is removed during the etching of the second hard mask layer of the cell region.

19. The method of claim 17, wherein the second sacrificial pattern includes a amorphous carbon or a spin-on-carbon (SOC) layer.

20. The method of claim 17, wherein the spacer includes an oxide layer.

* * * * *